(12) United States Patent
Lue et al.

(10) Patent No.: US 8,547,741 B2
(45) Date of Patent: Oct. 1, 2013

(54) NONVOLATILE STACKED NAND MEMORY

(75) Inventors: Hang-Ting Lue, Hsinchu (TW);
Yi-Hsuan Hsiao, Budai Township (TW)

(73) Assignee: Macronix International Co., Ltd., Hsinchu (TW)

( * ) Notice: Subject to any disclaimer, the term of this patent is extended or adjusted under 35 U.S.C. 154(b) by 218 days.

(21) Appl. No.: 12/965,211

(22) Filed: Dec. 10, 2010

(65) Prior Publication Data
US 2012/0147675 A1    Jun. 14, 2012

(51) Int. Cl.
*G11C 5/02* (2006.01)
*G11C 5/06* (2006.01)
*G11C 16/04* (2006.01)

(52) U.S. Cl.
USPC ................. 365/185.05; 365/185.17; 365/51; 365/63; 365/72

(58) Field of Classification Search
USPC ................. 365/185.05, 185.17, 51, 63, 72
See application file for complete search history.

(56) References Cited

U.S. PATENT DOCUMENTS

| | | | |
|---|---|---|---|
| 2005/0280061 A1* | 12/2005 | Lee ................................ | 257/296 |
| 2007/0252201 A1* | 11/2007 | Kito et al. .................... | 257/331 |
| 2008/0259687 A1* | 10/2008 | Specht et al. ............ | 365/185.17 |
| 2009/0310425 A1* | 12/2009 | Sim et al. ................. | 365/185.29 |
| 2010/0020617 A1* | 1/2010 | Oh et al. ................... | 365/185.23 |
| 2010/0078701 A1* | 4/2010 | Shim et al. ..................... | 257/314 |
| 2010/0090188 A1* | 4/2010 | Futatsuyama ...................... | 257/2 |
| 2010/0140685 A1* | 6/2010 | Kang et al. ..................... | 257/324 |
| 2010/0202206 A1* | 8/2010 | Seol et al. ................ | 365/185.17 |
| 2012/0001247 A1* | 1/2012 | Alsmeier ....................... | 257/316 |

OTHER PUBLICATIONS

Yoshiaki Fukuzumi et al. "Optimal Integration and Characteristics of Vertical Array Devices for Ultra-High Density, Bit-Cost Scalable Flash Memory," IEEE 2007, pp. 449-452.
Jiyoung Kim et al. Novel 3-D Structure for Ultra High Density Flash Memory with VRAT (Vertical-Recess-Array-Transistor) and PIPE (Planarized Integration on the same Plan E), 2008 Symposium on VLSI Technology Digest of Technical Papers, pp. 122-123.
Jiyoung Kim et al. "Novel Vertical-Stacked-Array-Transistor (VSAT) for Ultra-High-Density and Cost-Effective NAND Flash Memory Devices and SSD (Solid State Drive)", 2009 Symposium on VLSI Technology Digest of Technical Papers, pp. 186-187.

* cited by examiner

*Primary Examiner* — J. H. Hur
(74) *Attorney, Agent, or Firm* — Kenta Suzue; Haynes Beffel & Wolfeld LLP

(57) ABSTRACT

A NAND string of memory cells has stacks of split word lines (gates), with resulting increased bit density. Variants add a top assist gate to the NAND string, a bottom assist gate to the NAND string, or both a top assist gate and a bottom assist gate to the NAND string.

19 Claims, 24 Drawing Sheets

NONVOLATILE STACKED NAND MEMORY

BACKGROUND

1. Field of the Invention

This technology relates to nonvolatile NAND memory, with neighboring memory cells arranged sequentially in a vertical dimension out of the plane of the substrate and not just in a horizontal dimension along or parallel to the plane of the substrate.

2. Description of Related Art

In Jiyoung Kim et al., "Novel 3-D Structure for Ultra High Density Flash Memory with VRAT (Vertical-Recess-Array-Transistor)" pp. 122-123, 2008 Symposium on VLSI Technology Digest of Technical Papers, incorporated by reference, stacked memory cells are arranged with the channel running in a interior region covered by the stacked gates and charge storage material. This approach separates neighboring columns of gates with intervals of horizontal channel. This approach requires the creation of multiple undercuts which must be filled with the gate electrodes.

In Jiyoung Kim et al., "Novel Vertical-Stacked-Array-Transistor (VSAT) for ultra-high-density and cost-effective NAND Flash memory devices and SSD (Solid State Drive)" pp. 186-187, 2009 Symposium on VLSI Technology Digest of Technical Papers, incorporated by reference, stacked memory cells are arranged with the channel running in an exterior region covered by the stacked gates and charge storage material. In this approach, intervals of horizontally oriented channel separate neighboring stacks of gates, and intervals of vertically oriented channel run up one side and down the other side of each stack. To help reduce the off current, the stacks are each a single gate wide, with each gate controlling both of the vertically oriented lengths of channel, with one vertically oriented length of channel on each side of each gate.

SUMMARY

One aspect of the technology is a memory device, which includes a NAND string of a plurality of memory cells arranged in electrical series between a first end and a second end on a semiconductor body. The NAND string includes a plurality of stacks of word lines, and a semiconductor channel material covering the plurality of stacks.

The word lines within a stack of the plurality of stacks are mutually electrically separated, for example by dielectric such as an oxide. The plurality of stacks extend out of the semiconductor body.

The semiconductor channel material covers the plurality of stacks. An example of semiconductor channel material is polysilicon. The NAND string has an electrical series connection between the first end and the second end of the NAND string via the semiconductor channel material. In some embodiments, this electrical series connection is turned on when all the gates along the NAND string have a voltage turning on the portion of the semiconductor channel material controlled by a particular gate, and if select transistors on both ends of the NAND string are on. In some embodiments, this electrical series connection is turned off when one or more gates along the NAND string have a voltage turning off the portion of the semiconductor channel material controlled by a particular gate, or if a select transistor on either end of the NAND string is off. The semiconductor channel material, which covers the plurality of stacks of word lines, is arranged as a plurality of ridges extending out of the semiconductor body. A ridge (of the semiconductor channel material) in the plurality of ridges covers multiple adjacent stacks in the plurality of stacks of word lines. For example, a first ridge of the semiconductor channel material covers a first and a second adjacent stack of word lines.

Some embodiments include a nonconductive material electrically separating the multiple stacks covered by a ridge of the plurality of ridges of the semiconductor channel material. Such nonconductive material is, for example, an oxide. In another example, the oxide is part of an oxide-charge trapping nitride-oxide structure, which shares the same material as the oxide-charge trapping nitride-oxide structure that covers the plurality of stacks, because of a shared processing step.

Some embodiments include bottom assist gate material covered by the plurality of stacks of word lines and the semiconductor channel material. The bottom assist gate material helps control the portions of the semiconductor channel material proximate to the bottom assist gate material. In some embodiments, the bottom assist gate material helps control the horizontally oriented portions of the semiconductor channel material. In some embodiments, control circuitry applies biases to utilize the bottom assist gate material. For example, the control circuitry applies a first bias to the bottom assist gate material assisting turn off of the electrical series connection through the semiconductor channel material, and a second bias to the bottom assist gate material assisting turn on of the electrical series connection through the semiconductor channel material, the first bias being less than the second bias. In another example, the control circuitry applies a negative bias to the bottom assist gate material resisting leakage during programming.

Some embodiments include top assist gate material covering the plurality of stacks of word lines and the semiconductor channel material. The top assist gate material helps control the portions of the semiconductor channel material proximate to the top assist gate material. In some embodiments, the top assist gate material helps control the vertically oriented portions of the semiconductor channel material. In some embodiments, control circuitry applies biases to utilize the top assist gate material. For example, the control circuitry applies a positive bias to the top assist gate material assisting erasing of the NAND string. In another example, control circuitry applies a first bias to the top assist gate material assisting programming of a memory cell in the NAND string, and a second bias to the top assist gate material resisting programming of the NAND string, the first bias being less than the second bias.

Some embodiments include charge storage material covering the plurality of stacks. The semiconductor channel material covers the charge storage material, such as charge trapping material. The state of charge storage in the portion of the charge storage material proximate to the corresponding gate determines whether a particular NAND memory cell turns the channel on or off in the corresponding part of the semiconductor channel material.

Some embodiments include charge storage material between the multiple adjacent stacks covered by the ridge of the semiconductor channel material. Such charge storage material is not necessarily proximate to semiconductor channel material, and accordingly can have relatively little influence on the operation of the NAND string of memory cells. However, in some embodiments, this charge storage material is formed along with the charge storage material which covers the plurality of stacks of word lines as part of depositing an oxide-charge trapping nitride-oxide structure, thereby saving a processing step.

Another aspect of the technology is a method of making the NAND string, in particular forming a NAND string of a plurality of memory cells arranged in electrical series between a first end and a second end on a semiconductor body. The method steps include:

forming a first plurality of stacks extending out of the semiconductor body, stacks in the first plurality of stacks including word line material word layers that are mutually electrically separated;

forming a second plurality of stacks from the first plurality of stacks, by removing intermediate parts of the first plurality of stacks, the second plurality of stacks having more stacks than the first plurality of stacks, wherein the word line material layers in the second plurality of stacks are of word lines of the plurality of memory cells in the NAND string;

covering the second plurality of stacks with a semiconductor channel material, the NAND string having an electrical series connection between the first end and the second end of the NAND string via the semiconductor channel material.

One embodiment includes:

prior to forming the first plurality of stacks, forming bottom assist gate material covering the semiconductor body.

Some embodiments with the bottom assist gate material further include the step of:

providing control circuitry applying a first bias to the bottom assist gate material, the first bias assisting turn off of the electrical series connection through the semiconductor channel material, and a second bias to the bottom assist gate material assisting turn on of the electrical series connection through the semiconductor channel material, the first bias being less than the second bias.

Some embodiments with the bottom assist gate material further include the step of:

providing control circuitry applying a negative bias to the bottom assist gate material resisting leakage during programming.

One embodiment includes:

after covering the second plurality of stacks with a semiconductor channel material, forming top assist gate material covering the semiconductor channel material.

Some embodiments with the top assist gate material further include the step of:

providing control circuitry applying first bias to the top assist gate material assisting programming of a memory cell in the NAND string, and a second bias to the top assist gate material resisting programming of the NAND string, the first bias being less than the second bias.

Some embodiments with the top assist gate material further include the step of:

providing control circuitry applying a positive bias to the top assist gate material assisting erasing of the NAND string.

One embodiment includes:

before covering the second plurality of stacks with the semiconductor channel material, covering the second plurality of stacks with a charge storage structure.

One embodiment includes:

forming nonconductive material in gaps formed by removing the intermediate parts.

Some embodiments with nonconductive material in gaps formed by removing the intermediate parts, further include the step of:

before covering the second plurality of stacks with the semiconductor channel material, covering the second plurality of stacks with charge storage structure including a first oxide layer, a charge storage layer covering the first oxide layer, and a second oxide layer covering the first oxide layer.

Other embodiments are disclosed herein.

DETAILED DESCRIPTION

Figure 1:
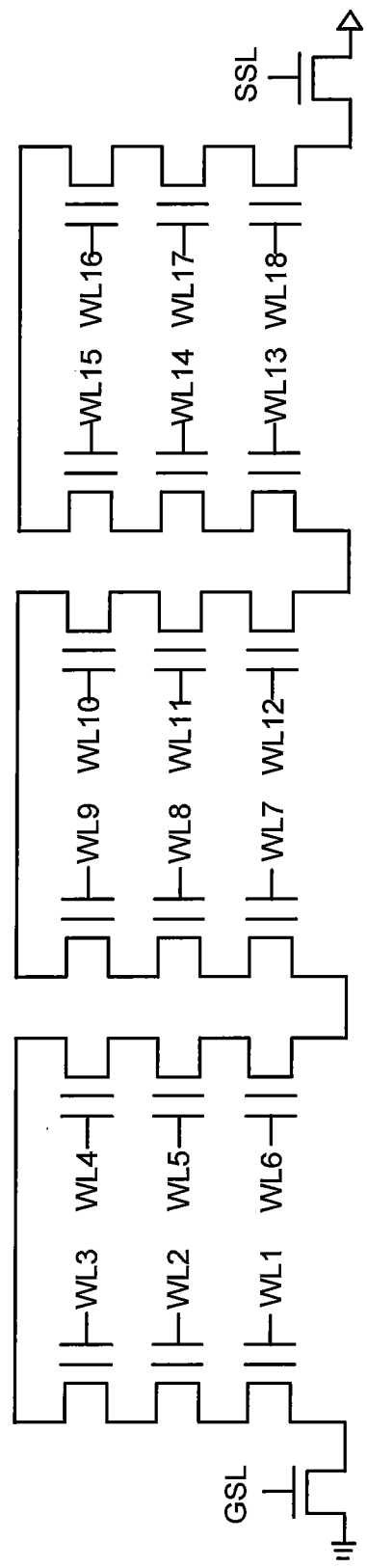
FIG. 1 shows an equivalent circuit of an example stacked NAND string, with a circuit diagram arrangement approximating the actual physical arrangement of the example stacked NAND string.

FIG. 1 shows an equivalent circuit of an example stacked NAND string, with a circuit diagram arrangement approximating the actual physical arrangement of the example stacked NAND string.

The example equivalent circuit shows a NAND string generally arranged into three ridges, with each ridge containing six gates. The six gates are divided into two stacks of three gates. The left ridge has stacked word lines WL1, WL2, WL3 going up one side of the left ridge and stacked word lines WL4, WL5, WL6 going down the other side of the left ridge. The center ridge has stacked word lines WL7, WL8, WL9 going up one side of the center ridge and stacked word lines WL10, WL11, WL12 going down the other side of the center ridge. The right ridge has stacked word lines WL13, WL14, WL15 going up one side of the right ridge and stacked word lines WL16, WL17, WL18 going down the other side of the right ridge.

Because each ridge effectively includes multiple gates that have been split in the horizontal direction, bit density is multiplied (doubled, in the shown case).

Other embodiments have a different number of ridges and/or a different number of word lines in each word line stack. In this arrangement, the gates are in the relative interior of the ridges and the channel is on the relative exterior of the ridges.

The NAND string is terminated on both ends by a select transistors, a GSL (ground select) transistor and a SSL (source select) transistor. The SSL and GSL process is done in the same patterning process as the word lines. However, the gate length of the SSL/GSL is decided by layout.

Another embodiment has multiple adjacent NAND strings shown in FIG. 1, with the same word lines running through the adjacent NAND strings, and the different NAND strings being distinguished by different bit lines connecting to the different NAND strings via the SSL select transistor.

FIGS. 2-15 show an example series of processing steps to manufacture a stacked NAND string, with both a top assist gate and a bottom assist gate.

Figure 2:
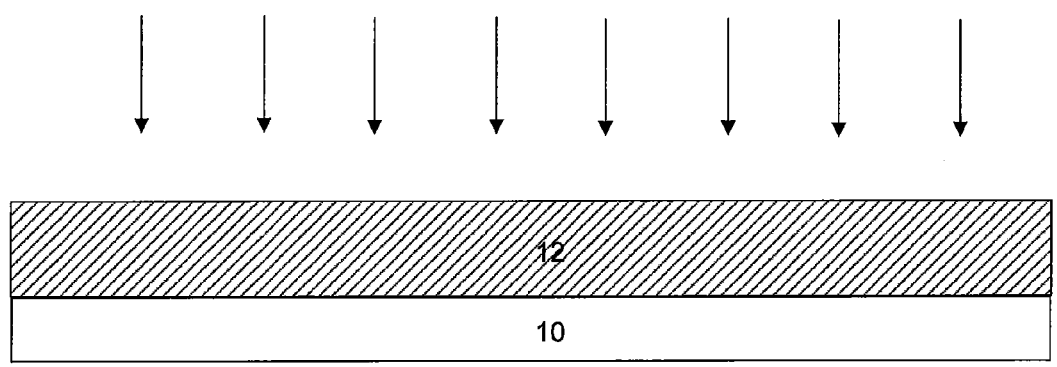
FIGS. 2-15 show an example series of processing steps to manufacture a stacked NAND string, with both a top assist gate and a bottom assist gate.

FIG. 2 shows a p-type substrate 10. Implantation is performed to form the bottom assist gate 12. Activation of the implanted ions, such as by annealing, reduces parasitic resistance.

Figure 3:
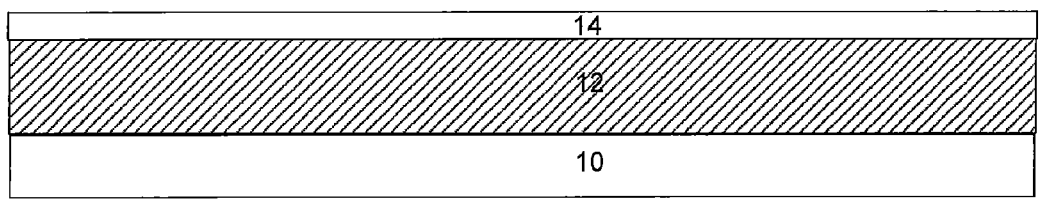

FIG. 3 shows formation of the bottom assist gate dielectric 14.

Figure 4:
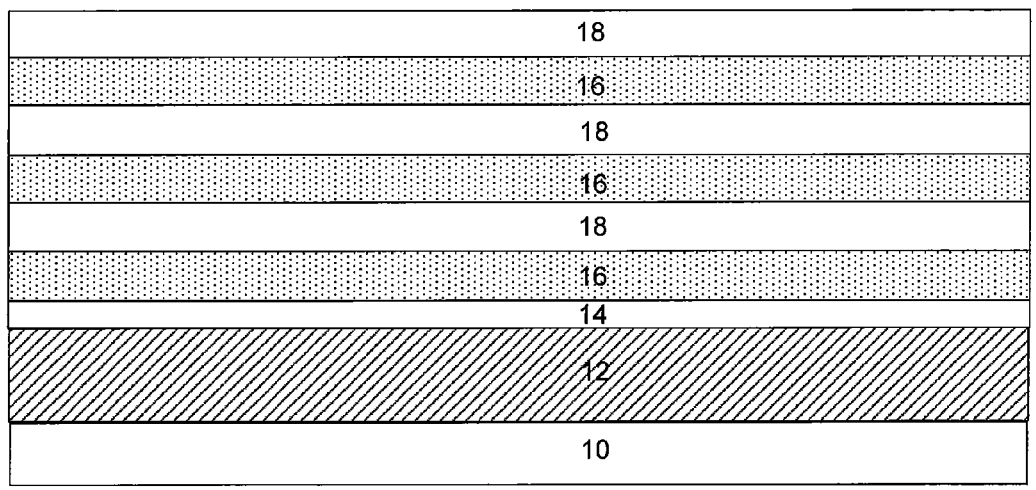

FIG. 4 shows formation of the alternating layers of polysilicon 16 and buried oxide 18. The polysilicon ultimately forms the stacked word lines of the NAND string, the polysilicon word lines in the same stack being mutually electrically separated by the buried oxide.

Figure 5:
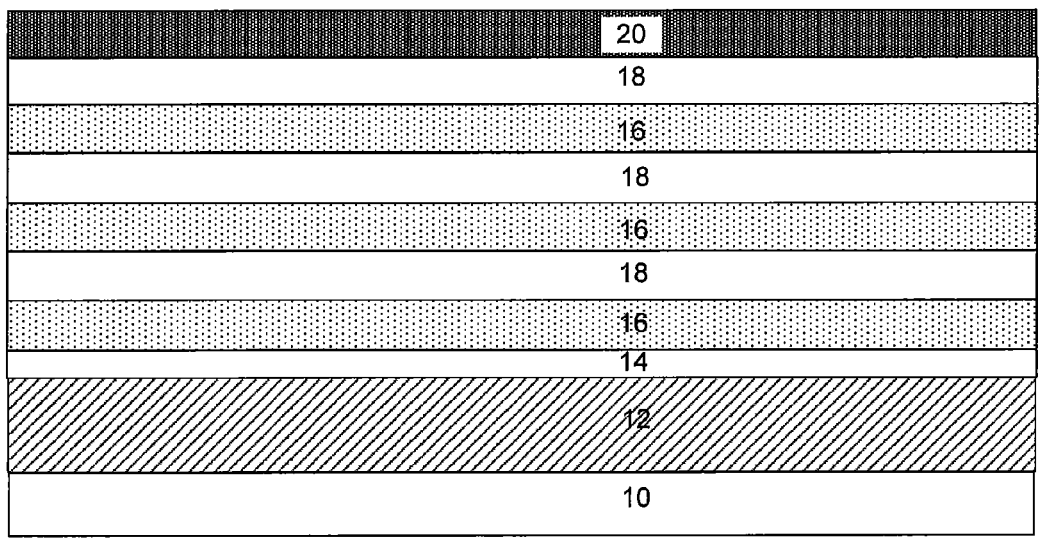

FIG. 5 shows formation of the hard mask 20, such as SiN.

Figure 6:
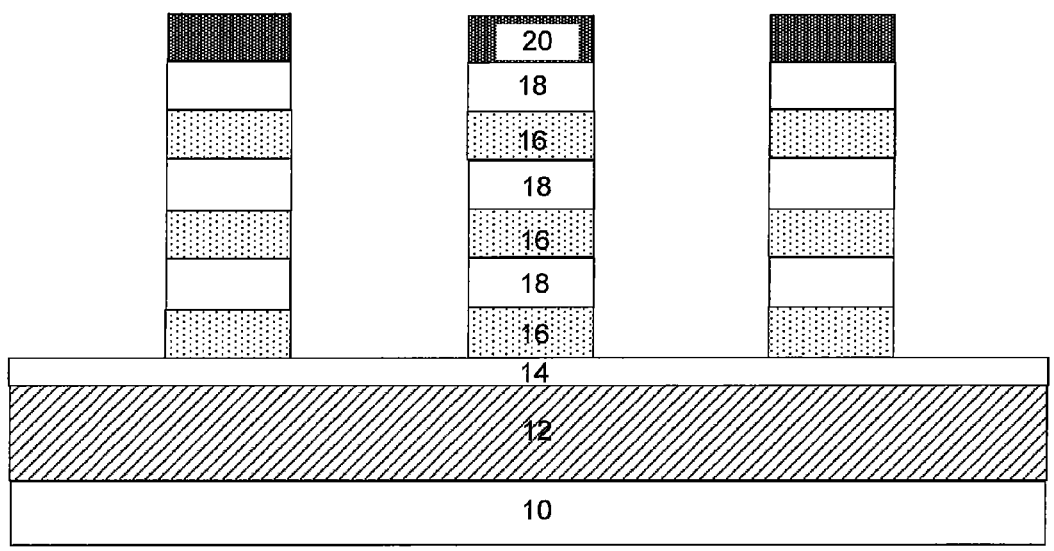

FIG. 6 shows patterning of the hard mask 20, with the remaining parts of the hard mask 20 allowing etching of unmasked portions of the polysilicon 16 and buried oxide 18. Stacks of word line material, mutually electrically isolated by oxide material, are formed.

Figure 7:
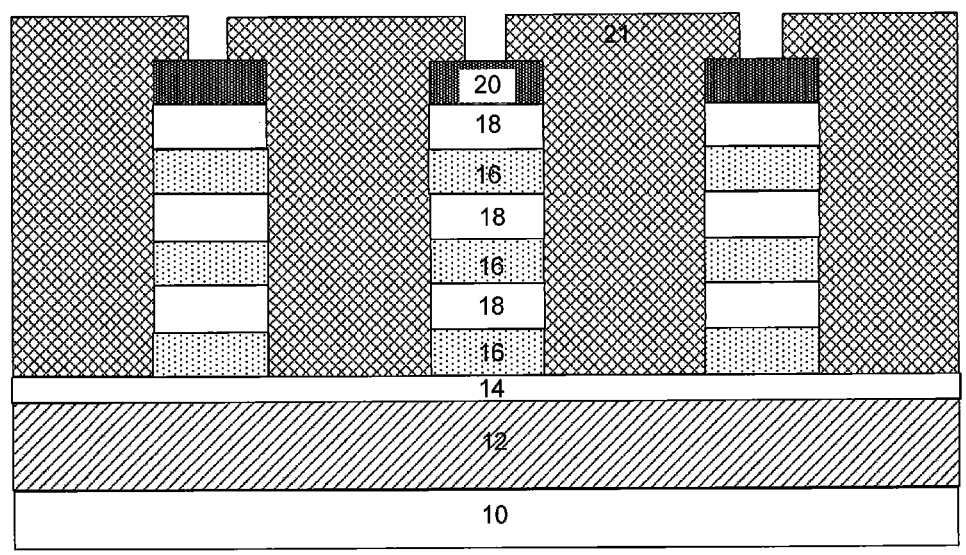

FIG. 7 shows photoresist 21 which is patterned to split the stacks of word line material.

Figure 8:
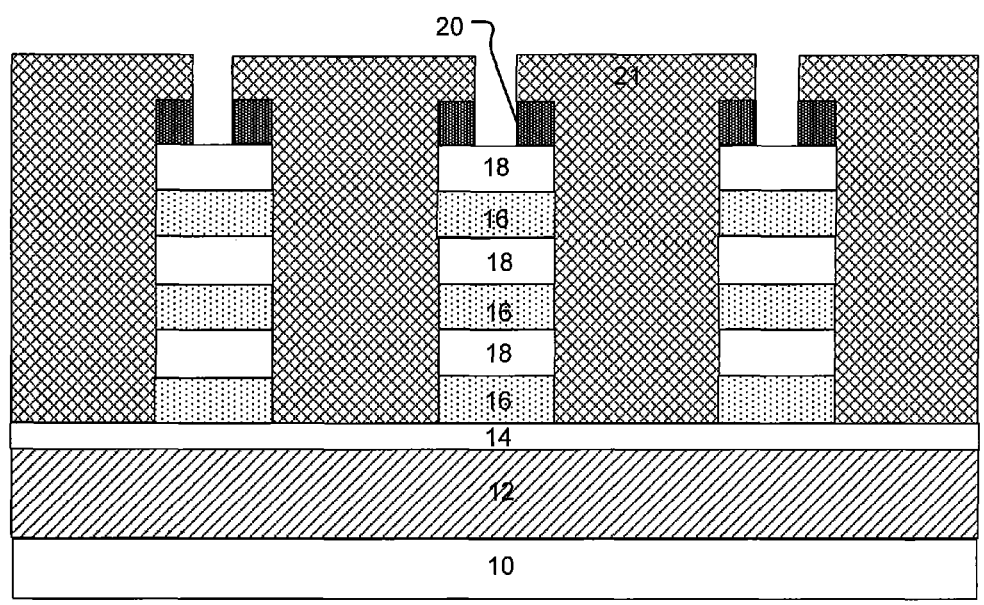

FIG. 8 shows etching of portions of the hard mask 20 that are unprotected by the photoresist 21.

Figure 9:
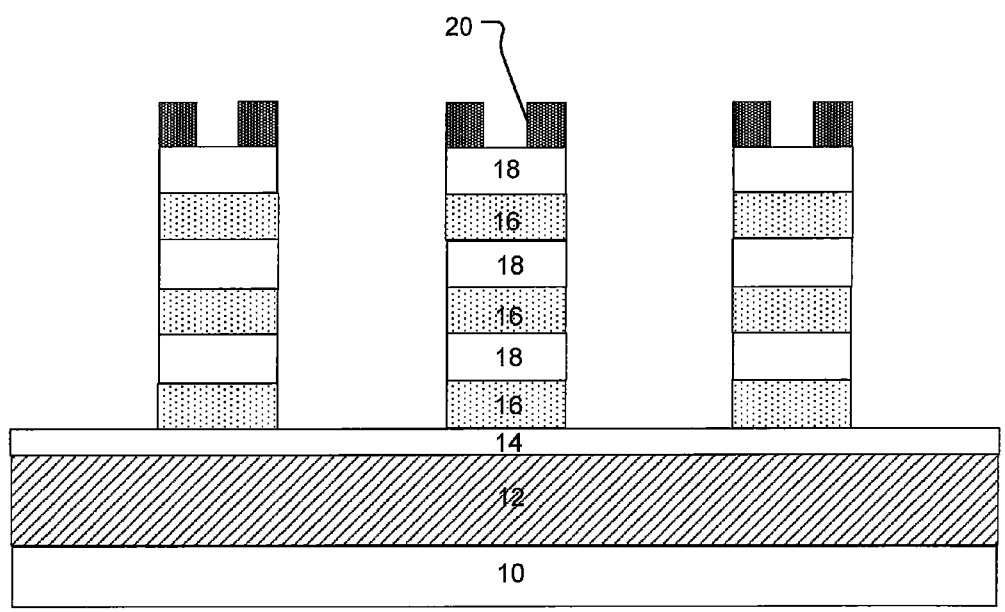

FIG. 9 shows removal of the photoresist 21 that protected portions of the hard mask 20.

Figure 10:
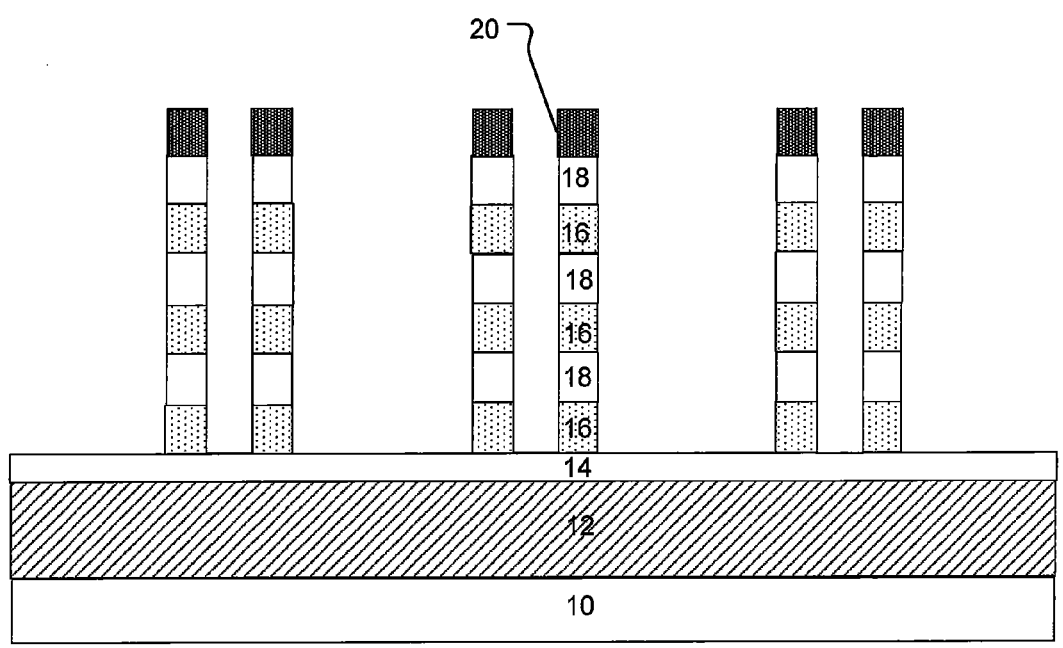

FIG. 10 shows etching of unmasked portions of the polysilicon 16 and buried oxide 18, until the gate dielectric. The stacks of word line material, mutually electrically isolated by oxide material, which were previously formed, are effectively doubled in quantity.

Figure 11:
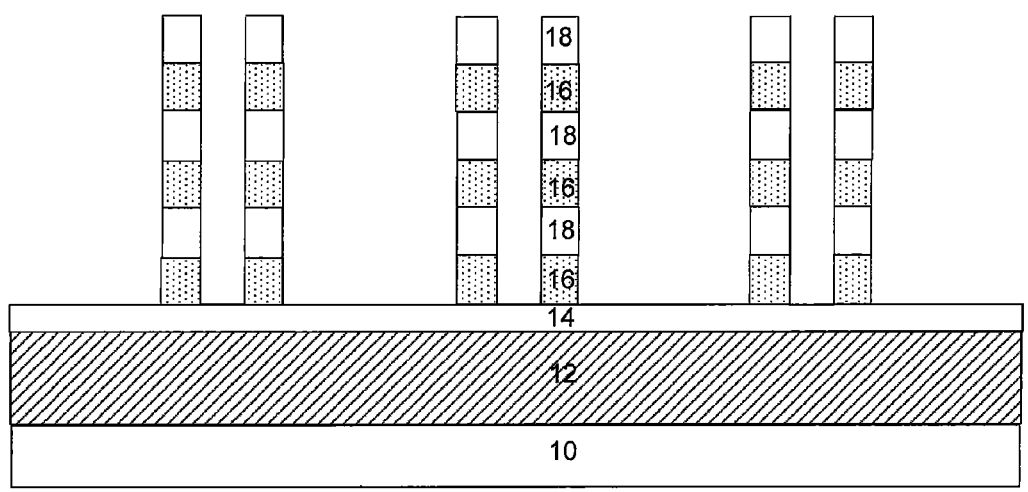

FIG. 11 shows removal of the hard mask 20. Mask misalignments to form the word line stacks affects word line thickness, but is not an issue for cell characteristics, due to the self-aligned ONO and channel deposition processes.

Figure 12:
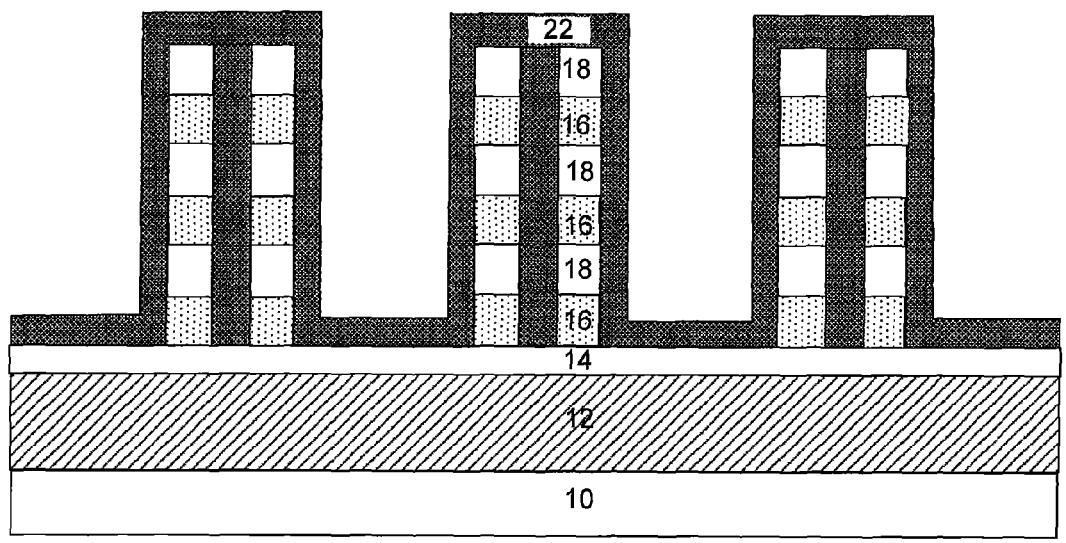

FIG. 12 shows formation of material 22, which is both: (i) the oxide into the gap formed by the etching step of FIG. 10, which electrically separates the adjacent word line stacks, and (ii) the charge storage material, such as charge trapping nitride, covering all of the word line columns. An example is oxide-charge trapping nitride-oxide. Alternatively, the steps of (i) and (ii) could be performed in different steps.

Figure 13:
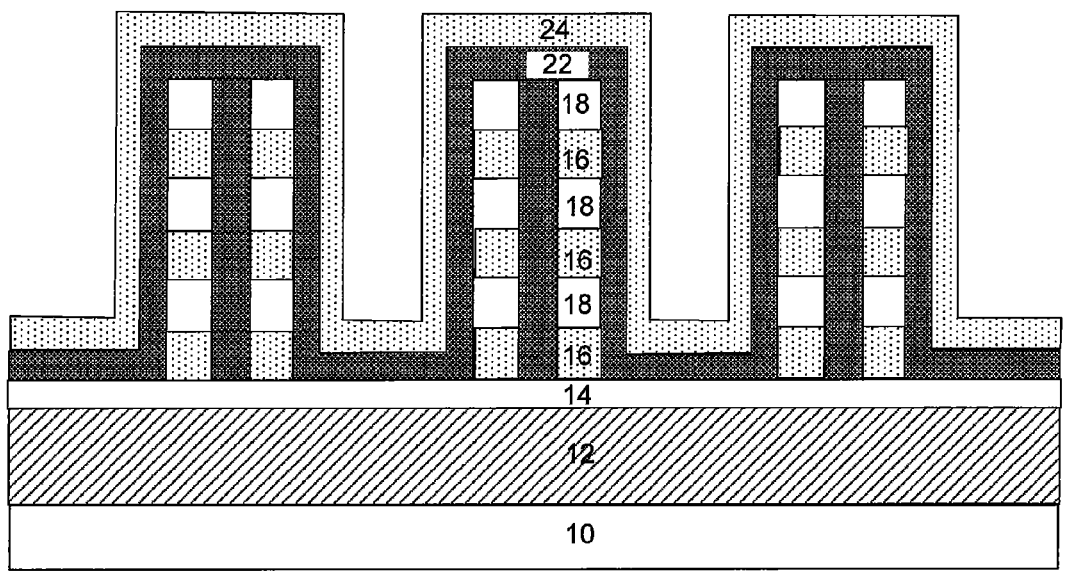

FIG. 13 shows formation of the semiconductor channel material 24, such as polysilicon.

Figure 14:
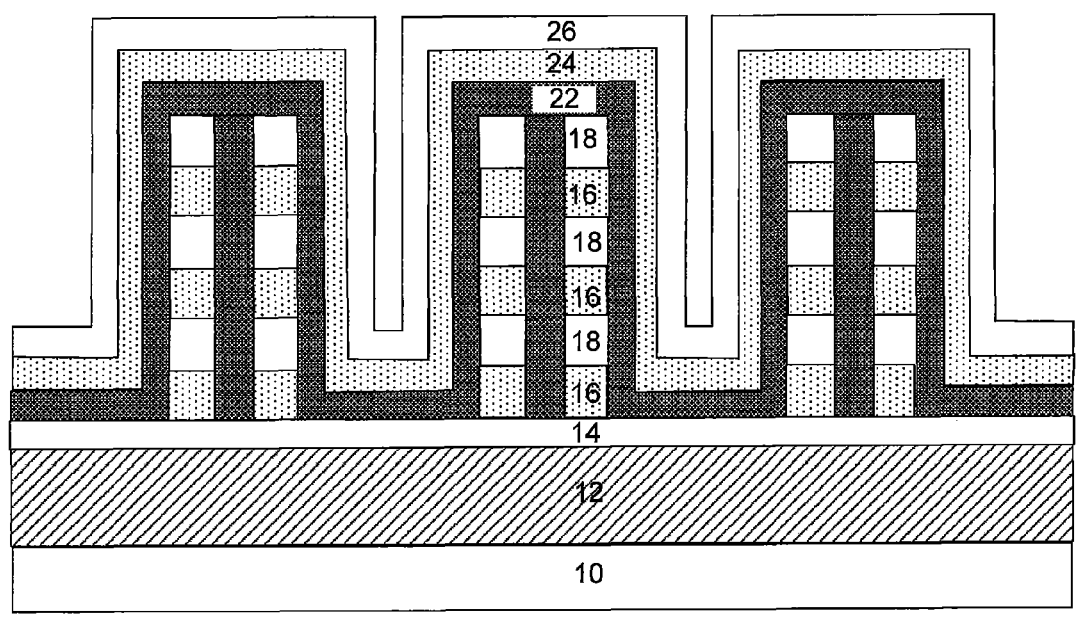

FIG. 14 shows formation of the top assist gate dielectric 26.

Figure 15:
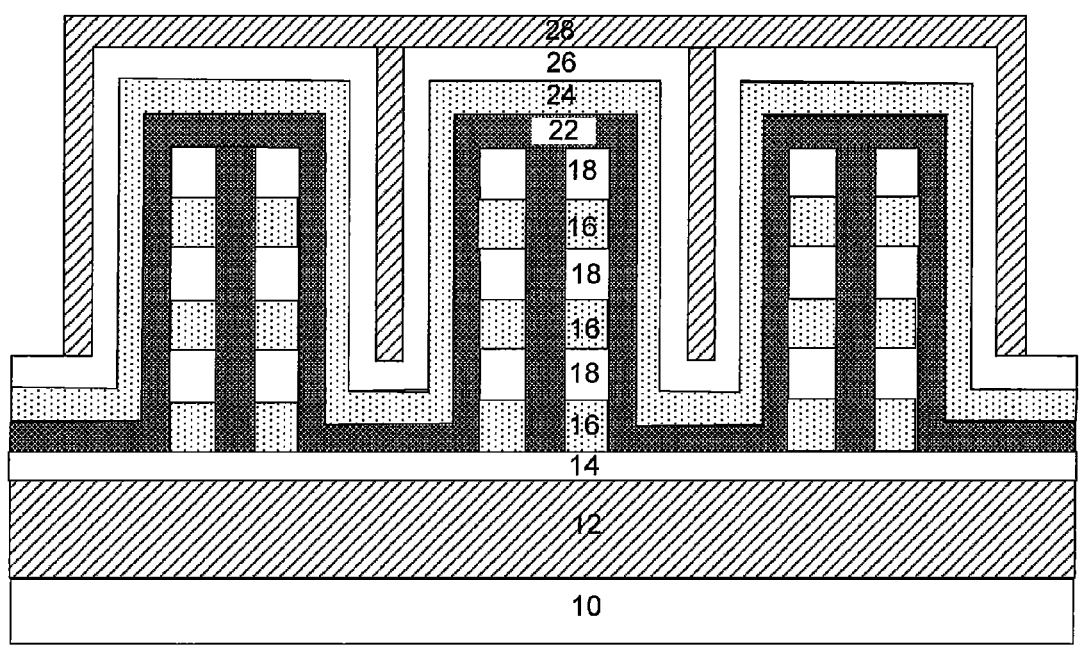

FIG. 15 shows formation of the top assist gate 28.

The stacked NAND string of FIG. 15 is also referred to as Asymmetrical Vertical Stackable NAND memory with Assisted Double Gate memory.

The stacked NAND string of FIG. 15 has increased bit density, due to the two stacks of word lines under each ridge of semiconductor channel material, effectively doubling the bit density.

The top assist gate improves electrical characteristics of the stacked NAND string. The bottom assist gate reduces parasitic channel resistance of the stacked NAND string. In some embodiments, the top assist gate is connected from the top of the gate, and the bottom assist gate is connected from the bottom substrate.

Examples of different operations that bias the top assist gate and the bottom assist gate are as follows:

Reading: Assist gate bias can be the same as pass gate voltage, such as 7V~11V.

Programming/erasing: Floating the poly channel is significant; negative bias applied to bottom assist gate helps to turn off the channel.

Programming: For the selected cell, negative bias is applied to the top assist gate to enlarge the E-field, and improve programming speed. Positive bias is applied to the other top assist gates to reduce the E-field, and program disturb is suppressed. For the bottom assist gate, negative bias is set to reduce leakage in programming.

Erasing: Block erase is used and positive bias is applied to enlarge the erasing E-field, and improve the erasing speed.

Figure 16:
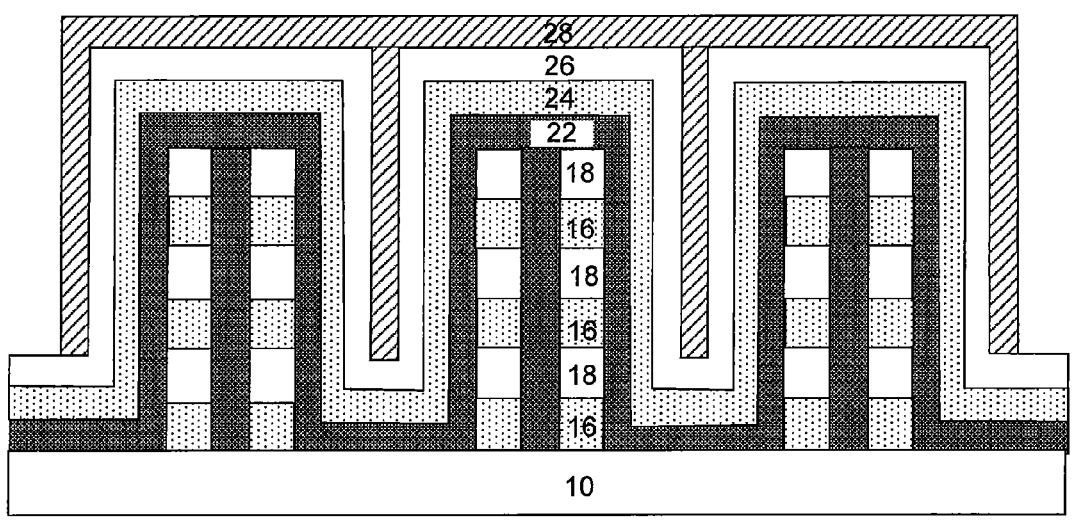
FIG. 16 shows another example of a stacked NAND string, with a top assist gate but without a bottom assist gate.

FIG. 16 shows another example of a stacked NAND string, with a top assist gate but without a bottom assist gate.

The stacked NAND string of FIG. 16 is also referred to as Asymmetrical Vertical Stackable NAND memory with Assisted Top Gate memory.

The stacked NAND string of FIG. 16 has increased bit density, due to the two stacks of word lines under each ridge of semiconductor channel material, effectively doubling the bit density.

The top assist gate improves electrical characteristics of the stacked NAND string.

Figure 17:
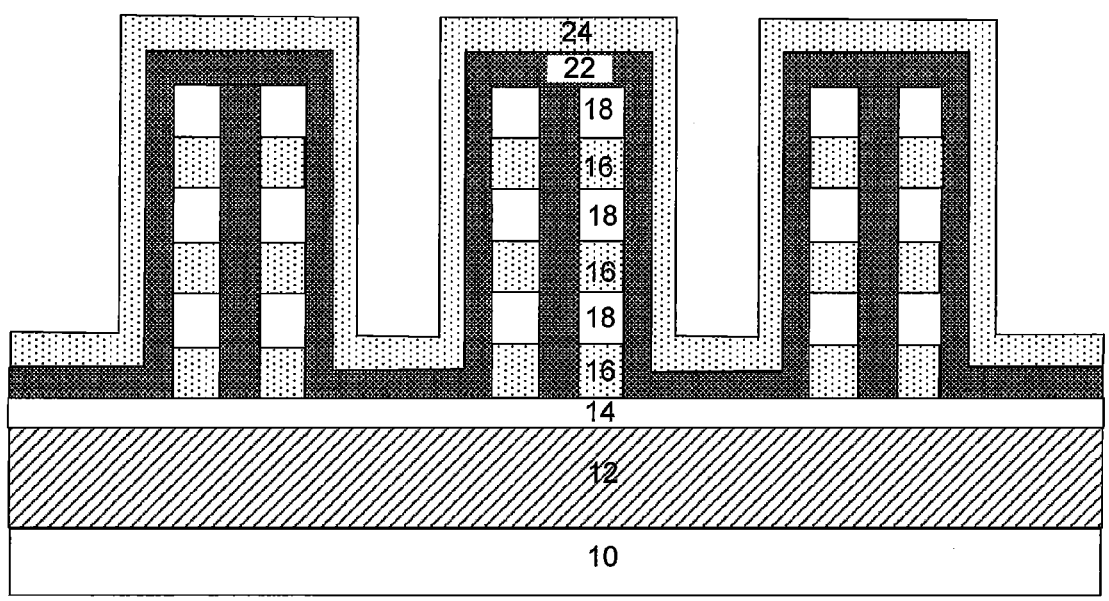
FIG. 17 shows another example of a stacked NAND string, with a bottom assist gate but without a top assist gate.

FIG. 17 shows another example of a stacked NAND string, with a bottom assist gate but without a top assist gate.

The stacked NAND string of FIG. 17 is also referred to as Asymmetrical Vertical Stackable NAND memory with Assisted Bottom Gate memory.

The stacked NAND string of FIG. 17 has increased bit density, due to the two stacks of word lines under each ridge of semiconductor channel material, effectively doubling the bit density.

The bottom assist gate reduces parasitic channel resistance of the stacked NAND string.

Figure 18:
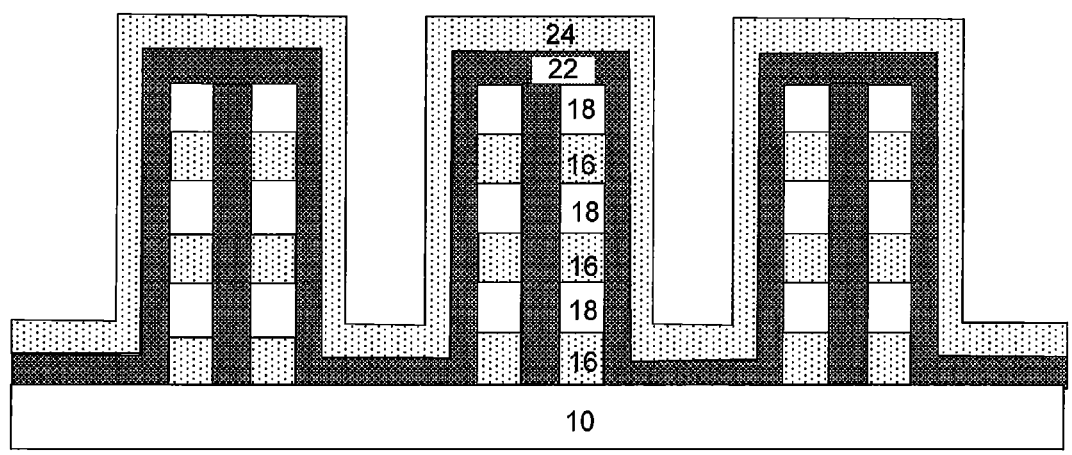
FIG. 18 shows another example of a stacked NAND string, with neither a top assist gate nor a bottom assist gate.

FIG. 18 shows another example of a stacked NAND string, with neither a top assist gate nor a bottom assist gate.

The stacked NAND string of FIG. 18 is also referred to as Asymmetrical Vertical Stackable NAND memory.

The stacked NAND string of FIG. 18 has increased bit density, due to the two stacks of word lines under each ridge of semiconductor channel material, effectively doubling the bit density.

Figure 19:
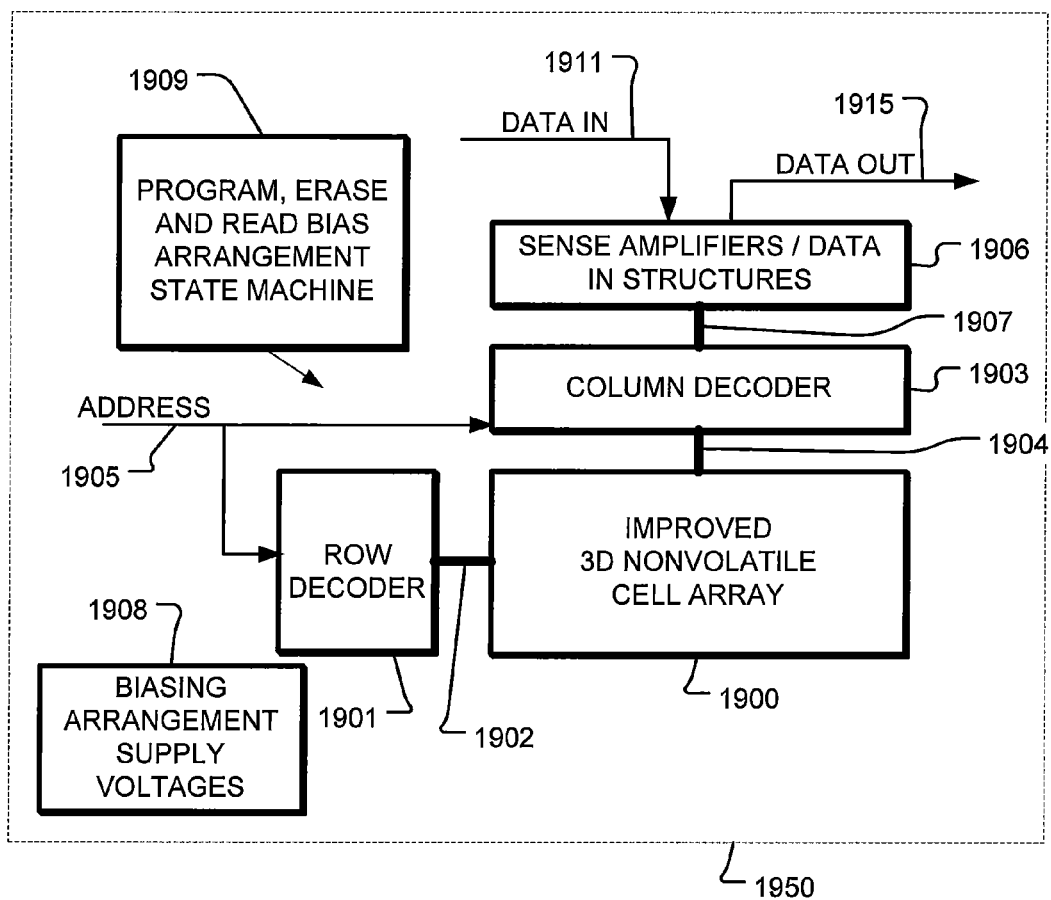
FIG. 19 shows a simplified block diagram of an integrated circuit with the stacked NAND string.

FIG. 19 shows a simplified block diagram of an integrated circuit with the stacked NAND string.

FIG. 19 shows an integrated circuit 1950 including an improved 3D nonvolatile memory cell array 1900. A word line decoder 1901 is coupled to, and in electrical communication with, a plurality of word lines 1902 arranged along row in the memory array 1900. A bit line decoder and drivers 1903 are coupled to and in electrical communication with a plurality of bit lines 1904 arranged along columns in the memory array 1900 for reading data from, and writing data to, the memory cells in the memory array 1900. Addresses are supplied on bus 1905 to the word line decoder and drivers 1901 and to the bit line decoder 1903. Sense amplifiers and data-in structures in block 1906, are coupled to the bit line decoder 1903 via the bus 1907. Data is supplied via the data-in line 1911 from input/output ports on the integrated circuit 1950, to the data-in structures in block 1906. Data is supplied via the data-out line 1915 from the sense amplifiers in block 1906 to input/output ports on the integrated circuit 1950, or to other data destinations internal or external to the integrated circuit 1950. A bias arrangement state machine is in circuitry 1909, controlling biasing arrangement supply voltages 1908. The bias arrangements provide biases to the 3D array including any top assist gate and/or bottom assist gate.

The following figures simulate:

(i) the VSAT structure 33 of Jiyoung Kim et al., "Novel Vertical-Stacked-Array-Transistor (VSAT) for ultra-high-density and cost-effective NAND Flash memory devices and SSD (Solid State Drive)" pp. 186-187, 2009 Symposium on VLSI Technology Digest of Technical Papers;

(ii) the AVS structure 32 such as shown in FIG. 18;

(iii) the AVS_AG (top gate) structure 31 such as shown in FIG. 16;

(iv) the AVS_BG (bottom gate) structure 30 such as shown in FIG. 17; and (v) the AVS_DG (double gate) structure 29 such as shown in FIG. 15.

Figures 20, 21:
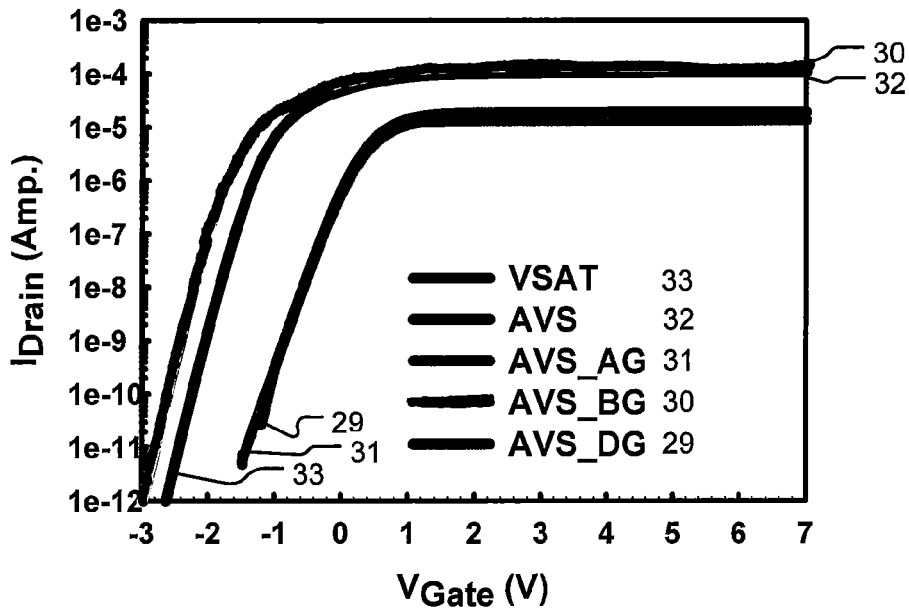
FIG. 20 shows a graph of drain current versus gate voltage for various simulated stacked NAND strings.
FIG. 21 shows a table of memory cell characteristics for various simulated stacked NAND strings.

FIG. 20 shows a graph of drain current versus gate voltage for various simulated stacked NAND strings.

FIG. 21 shows a table of memory cell characteristics for various simulated stacked NAND strings.

The table lists the characteristics of Vt (threshold voltage), SS (subthrehsold slope), and Gm (transconductance).

Compared to VSAT, the other stacked NAND structures double bit density with acceptable cell characteristics.

Figure 22:
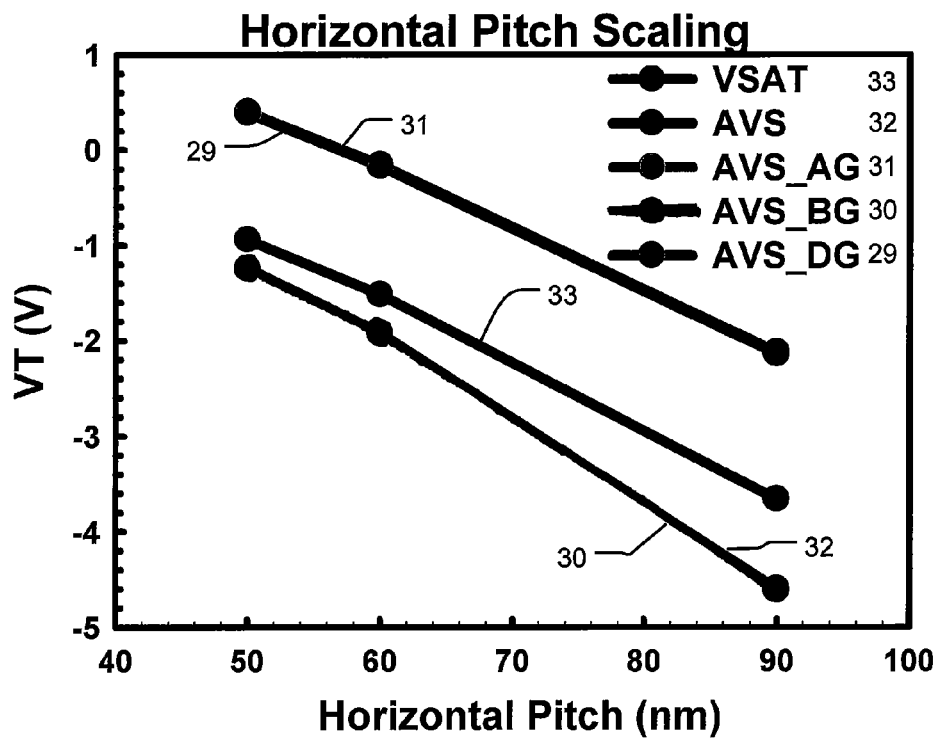
FIG. 22 shows a graph of threshold voltage versus horizontal pitch for various simulated stacked NAND strings.

FIG. 22 shows a graph of threshold voltage versus horizontal pitch for various simulated stacked NAND strings.

Figure 23:
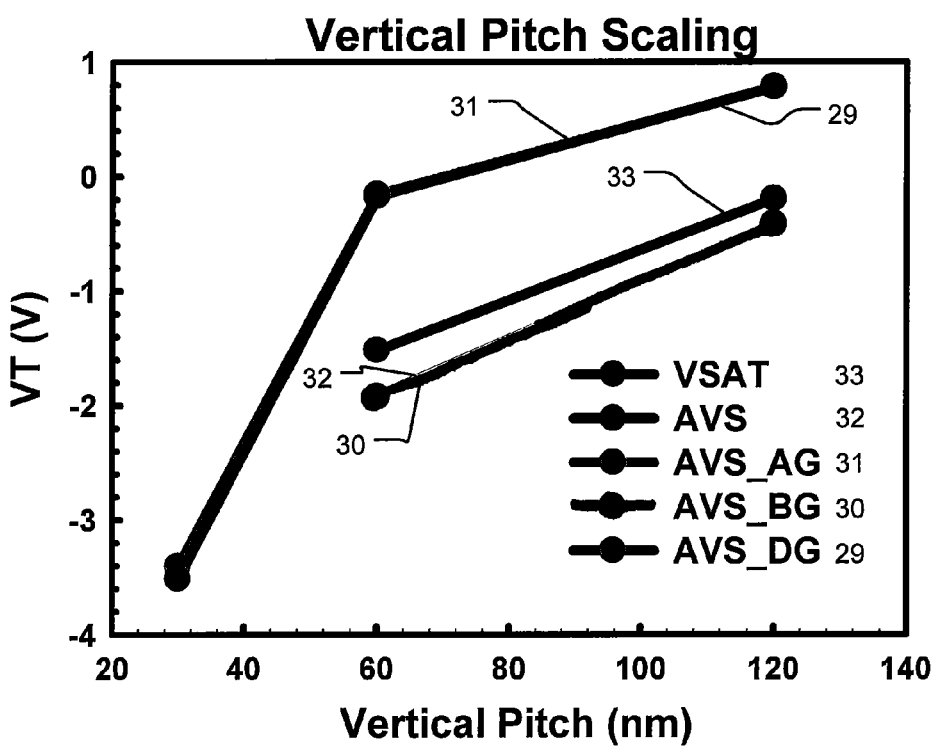
FIG. 23 shows a graph of threshold voltage versus vertical pitch for various simulated stacked NAND strings.

FIG. 23 shows a graph of threshold voltage versus vertical pitch for various simulated stacked NAND strings.

The assist gates enhance gate control ability, as well as control short channel effects.

Figure 24:
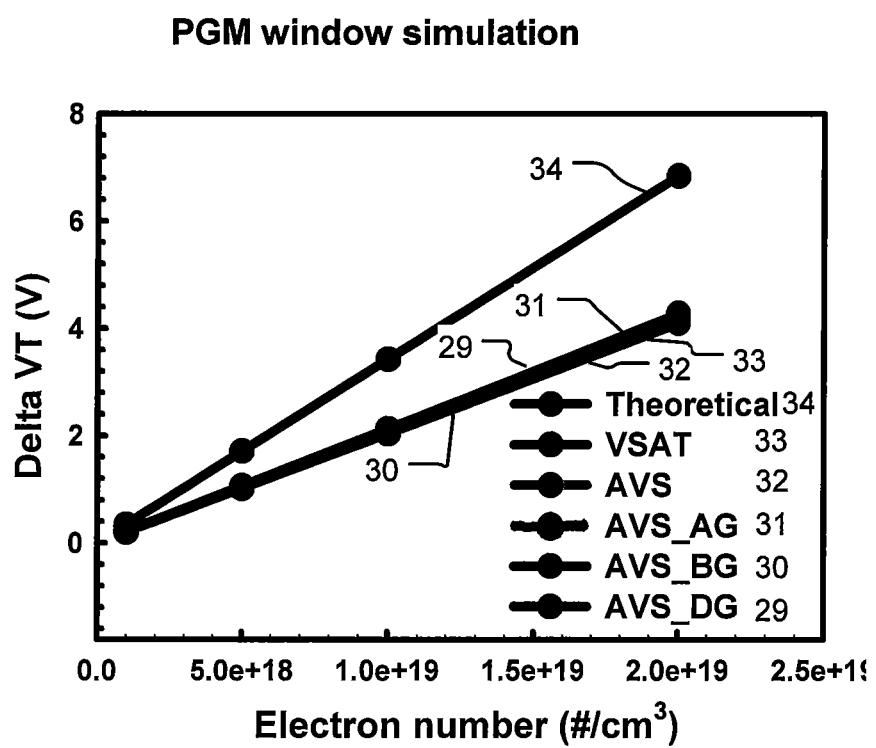
FIG. 24 shows a graph of threshold voltage change versus electron density for various simulated stacked NAND strings.

FIG. 24 shows a graph of threshold voltage change versus electron density for various simulated stacked NAND strings.

Also shown is the theoretical limit 34.

Compared to VSAT, the programming window is the same, but with doubled bit density.

Figure 25:
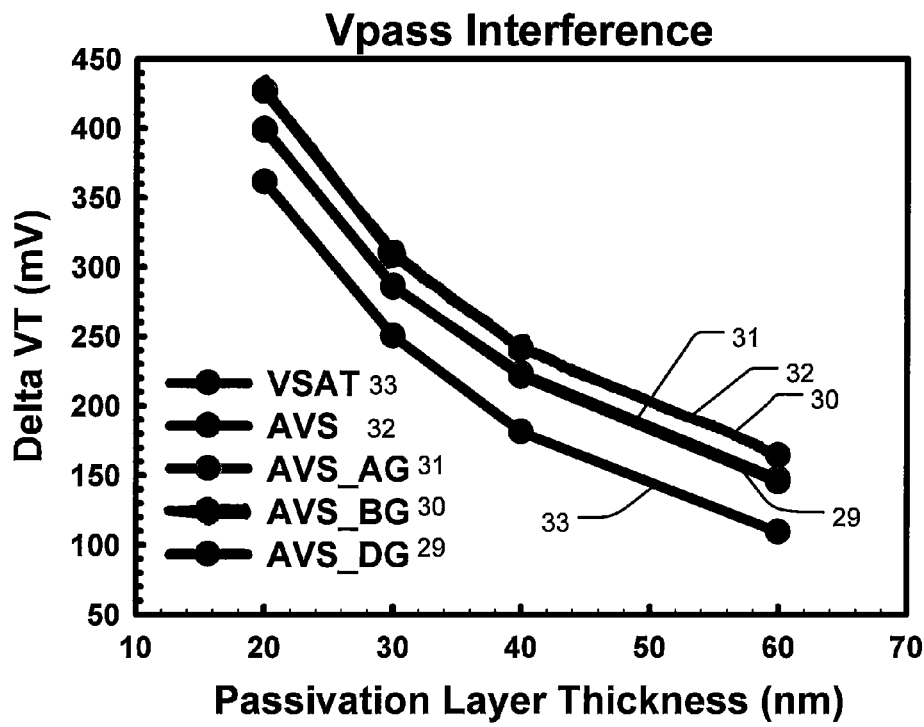
FIG. 25 shows a graph of Vpass interference for various simulated stacked NAND strings.

FIG. 25 shows a graph of Vpass interference for various simulated stacked NAND strings.

The Vpass interference refers to interference from adjacent pass gates.

Figure 26:
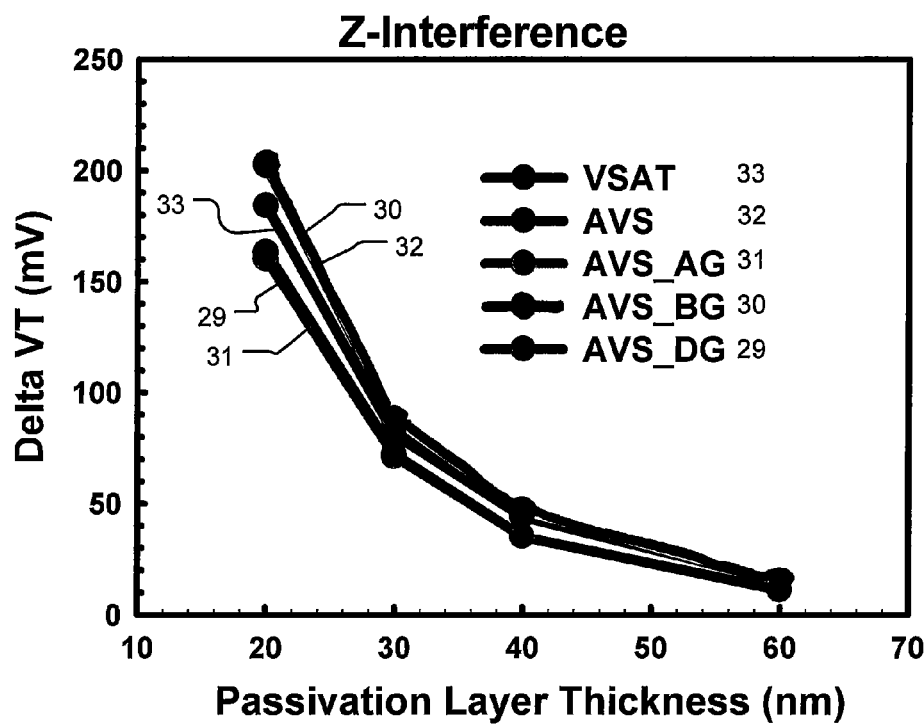
FIG. 26 shows a graph of Z-interference for various simulated stacked NAND strings.

FIG. 26 shows a graph of Z-interference for various simulated stacked NAND strings.

The Z-interference refers to interference from adjacent vertical layers.

Compared to conventional VSAT, interference in the other four stacked NAND structures is similar.

Figure 27:
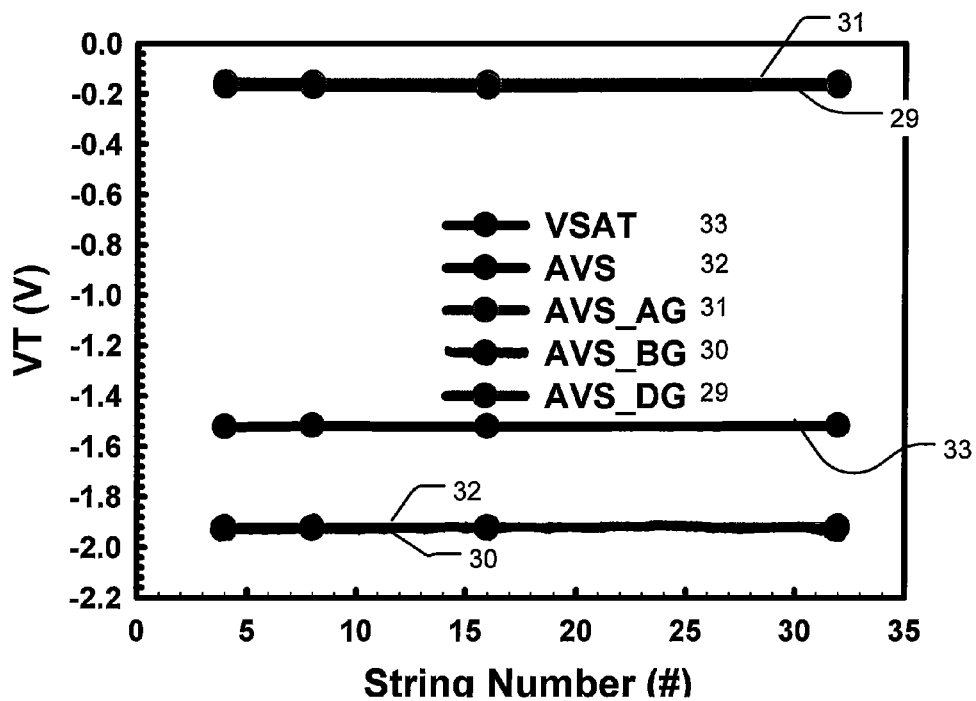
FIG. 27 shows a graph of threshold voltage versus string number for various simulated stacked NAND strings.

FIG. 27 shows a graph of threshold voltage versus string number for various simulated stacked NAND strings.

Figure 28:
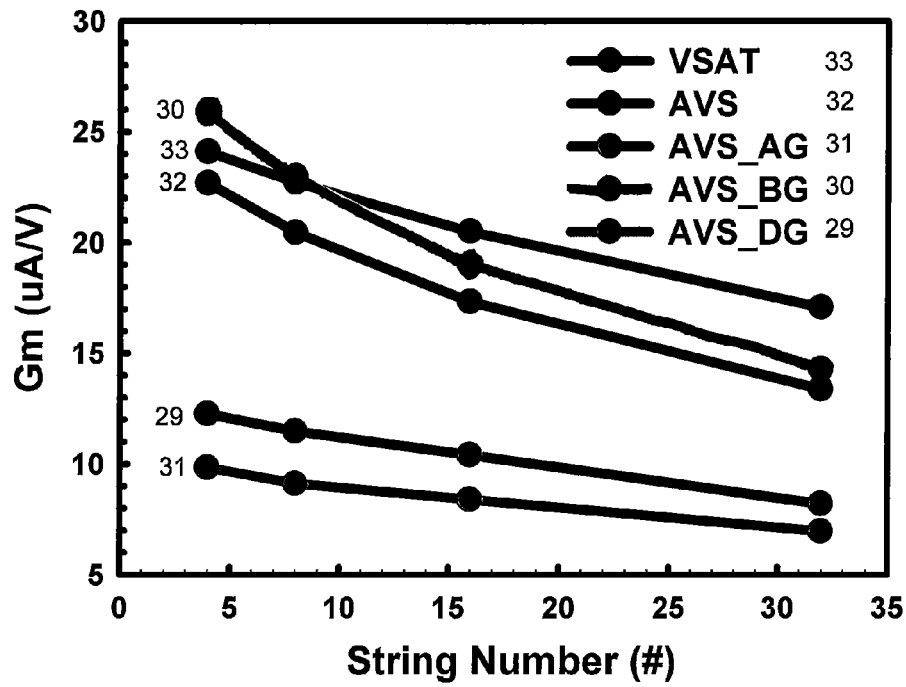
FIG. 28 shows a graph of gm versus string number for various simulated stacked NAND strings.

FIG. 28 shows a graph of gm versus string number for various simulated stacked NAND strings.

With assist gate designs, on-state current of stacked NAND strings are acceptable.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A memory device, comprising:
   a NAND string of a plurality of memory cells arranged in electrical series between a first end and a second end on a semiconductor body, including:
   a plurality of stacks of word lines, the word lines within a stack of the plurality of stacks being mutually electrically separated, the plurality of stacks extending out of the semiconductor body; and
   a semiconductor channel material covering the plurality of stacks of word lines and having multiple locations with conductivity controlled by different word lines in the plurality of stacks, the NAND string having an electrical series connection between the first end and the second end of the NAND string via the semiconductor channel material, the semiconductor channel material including a same type doping in between the first end and the second end, the semiconductor channel material arranged as a plurality of ridges extending out of the semiconductor body, wherein a ridge in the plurality of ridges covers multiple adjacent stacks in the plurality of stacks of word lines.

2. The memory device of claim 1, further comprising:
   a nonconductive material electrically separating the multiple adjacent stacks covered by the ridge of the plurality of ridges of the semiconductor channel material.

3. The memory device of claim 1, further comprising:
   bottom assist gate material covered by the plurality of stacks of word lines and the semiconductor channel material.

4. The memory device of claim 1, further comprising:
   bottom assist gate material covered by the plurality of stacks of word lines and the semiconductor channel material; and
   control circuitry applying a first bias to the bottom assist gate material assisting turn off of the electrical series connection through the semiconductor channel material, and a second bias to the bottom assist gate material assisting turn on of the electrical series connection through the semiconductor channel material, the first bias being less than the second bias.

5. The memory device of claim 1, further comprising:
   bottom assist gate material covered by the plurality of stacks of word lines and the semiconductor channel material; and
   control circuitry applying a negative bias to the bottom assist gate material resisting leakage during programming.

6. The memory device of claim 1, further comprising:
   top assist gate material covering the plurality of stacks of word lines and the semiconductor channel material.

7. The memory device of claim 1, further comprising:
   top assist gate material covering the plurality of stacks of word lines and the semiconductor channel material; and
   control circuitry applying a positive bias to the top assist gate material assisting erasing of the NAND string.

8. The memory device of claim 1, further comprising:
   top assist gate material covering the plurality of stacks of word lines and the semiconductor channel material; and
   control circuitry applying a first bias to the top assist gate material assisting programming of a memory cell in the NAND string, and a second bias to the top assist gate material resisting programming of the NAND string, the first bias being less than the second bias.

9. The memory device of claim 1, further comprising:
   charge storage material covering the plurality of stacks of word lines, the semiconductor channel material covering the charge storage material.

10. The memory device of claim 1, further comprising:
    charge storage material between the multiple adjacent stacks covered by the ridge of the plurality of ridges of the semiconductor channel material.

11. A memory device, comprising:
a NAND string of a plurality of memory cells arranged in electrical series between a first end and a second end on a semiconductor body, including:
  a plurality of stacks of word lines, the word lines within a stack of the plurality of stacks being mutually electrically separated, the plurality of stacks extending out of the semiconductor body; and
  a semiconductor channel material covering the plurality of stacks of word lines, the NAND string having an electrical series connection between the first end and the second end of the NAND string via the semiconductor channel material, the semiconductor channel material arranged as a plurality of ridges extending out of the semiconductor body, wherein a ridge in the plurality of ridges covers multiple adjacent stacks in the plurality of stacks of word lines; and
at least one of:
  (i) bottom assist gate material covered by the plurality of stacks of word lines and the semiconductor channel material; and,
  (ii) top assist gate material covering the plurality of stacks of word lines and the semiconductor channel material.

12. The memory device of claim 11, including at least the bottom assist gate material.

13. The memory device of claim 11, including at least the top assist gate material.

14. A memory device, comprising:
a plurality of memory cells arranged in electrical series between a first end and a second end on a semiconductor body, including:
  a plurality of stacks of word lines, the word lines within a stack of the plurality of stacks being mutually electrically separated;
  a plurality of stacks of insulating layers, the stacks of insulating layers electrically separating adjacent stacks of word lines from each other; and
  a semiconductor channel material conformally covering the stack of insulating layers, the semiconductor channel material including a same type doping in between the first end and the second end.

15. The memory device of claim 14, further comprising:
bottom assist gate material covered by the plurality of stacks of word lines and the semiconductor channel material.

16. The memory device of claim 15, further comprising:
control circuitry applying a first bias to the bottom assist gate material assisting turn off of the electrical series connection through the semiconductor channel material, and a second bias to the bottom assist gate material assisting turn on of the electrical series connection through the semiconductor channel material, the first bias being less than the second bias.

17. The memory device of claim 14, further comprising:
top assist gate material covering the plurality of stacks of word lines and the semiconductor channel material.

18. The memory device of claim 17, further comprising:
control circuitry applying a first bias to the top assist gate material assisting programming of a memory cell in the NAND string, and a second bias to the top assist gate material resisting programming of the NAND string, the first bias being less than the second bias.

19. The memory device of claim 14, further comprising:
charge storage material covering the plurality of stacks of word lines, the semiconductor channel material covering the charge storage material.

* * * * *